United States Patent
Li et al.

(10) Patent No.: US 11,070,228 B1
(45) Date of Patent: Jul. 20, 2021

(54) DATA COMPRESSOR AND DATA COMPRESSION METHOD

(71) Applicant: Shanghai Zhaoxin Semiconductor Co., Ltd., Shanghai (CN)

(72) Inventors: Lin Li, Beijing (CN); Zhiqiang Hui, Beijing (CN)

(73) Assignee: SHANGHAI ZHAOXIN SEMICONDUCTOR CO., LTD., Shanghai (CN)

( * ) Notice: Subject to any disclaimer, the term of this patent is extended or adjusted under 35 U.S.C. 154(b) by 0 days.

(21) Appl. No.: 17/035,931

(22) Filed: Sep. 29, 2020

(30) Foreign Application Priority Data

Jan. 8, 2020 (CN) .......................... 202010017087.9

(51) Int. Cl.
*H03M 7/30* (2006.01)
*H03M 7/40* (2006.01)
*H03M 7/42* (2006.01)

(52) U.S. Cl.
CPC ....... *H03M 7/3086* (2013.01); *H03M 7/4056* (2013.01); *H03M 7/42* (2013.01); *H03M 7/6064* (2013.01)

(58) Field of Classification Search
CPC .... H03M 7/3086; H03M 7/42; H03M 7/6064; H03M 7/4056
USPC .......................................................... 341/51
See application file for complete search history.

(56) References Cited

U.S. PATENT DOCUMENTS 9,979,414 B1 * 5/2018 Li ........................ G06F 3/0613
10,128,868 B1 * 11/2018 Gopal .................. H03M 7/6011

* cited by examiner

*Primary Examiner* — Khai M Nguyen
(74) *Attorney, Agent, or Firm* — McClure, Qualey & Rodack, LLP

(57) ABSTRACT

A data compressor with a hash computing hardware configured to evaluate the hash value for the current hash key extracted from a source data string, obtain a hash line corresponding to the hash value from a hash table, and perform hash key comparison to find at least one matching hash key. The hash line includes a prefix address column that stores a prefix address. Each entry of the hash line is provided to store a hash key and an offset. The hash computing hardware evaluates an address of the at least one matching hash key by combining the prefix address and an offset of the at least one matching hash key, and the offset of the at least one matching hash key is obtained from an entry storing the at least one matching hash key.

22 Claims, 7 Drawing Sheets

| prefix_old[15] | cur_addr[15] | prefix_new[31:15] | offset_new[15:0] | cur_offset[15:0] |
|---|---|---|---|---|
| x | x | {cur_addr[31:16],1'b0} | Invalid | cur_addr[15:0] |
| 0 | 0 | {prefix_old[31:16],1'b1} | {1'b0, offset_old[14:0]} | {1'b1, cur_addr[14:0]} |
| 1 | 0 | Not Changed | Not Changed | {1'b1, cur_addr[14:0]} |
| 0 | 1 | {cur_addr[31:16],1'b0} | Invalid | cur_addr[15:0] |
| 1 | 1 | {cur_addr[31:16],1'b0} | {1'b0, offset_old[14:0]} | cur_addr[15:0] |
| 0 | x | Not Changed | Not Changed | cur_addr[15:0] |
| 1 | 1 | Not Changed | Not Changed | cur_addr[15:0] |
| 1 | 0 | Invalid | Invalid | {1'b0, cur_addr[14:0]} |

DATA COMPRESSOR AND DATA COMPRESSION METHOD

CROSS REFERENCE TO RELATED APPLICATIONS

This application claims priority of China Patent Application No. 202010017087.9, filed on Jan. 8, 2020, the entirety of which is incorporated by reference herein.

BACKGROUND OF THE INVENTION

Field of the Invention

The present invention relates to data compression techniques, and, in particular, to sliding window compression.

Description of the Related Art

In a hash-based sliding window compression technology, a hash table is typically required to store a certain amount (for example, 2 KB, 4 KB, or 32 KB) of historical data (e.g., including hash keys and their addresses indicating their positions in the source data string) within a sliding window. Hash key comparison is performed based on the hash table. The historical data in the hash table is searched to find at least one matching hash key (which may be the same as the current hash key extracted from the source data string). The distance between the at least one matching hash key and the current hash key is evaluated. Then, more matching information (e.g., matched length) may be obtained. Some parts of the source data string can be replaced with the hash-based matching information (e.g., distance and matched length). Data compression, therefore, is achieved.

The storage of the historical hash keys and their addresses requires considerable space. How to reduce the storage space required by the historical hash keys and their addresses is an important subject in the technical field.

BRIEF SUMMARY OF THE INVENTION

A simplified data structure for a hash table that stores historical data for sliding window compression is disclosed.

The sliding window compression often involves hash calculations. In the disclosure, a data structure for the hash lines of a hash table required in hash calculations is shown.

A data compressor in accordance with an exemplary embodiment of the present invention includes a hash computing hardware and a storage device. The hash computing hardware is configured to evaluate a hash value for a current hash key extracted from a source data string, obtain a hash line corresponding to the hash value from a hash table, and perform hash key comparison to find at least one matching hash key that matches the current hash key from among the hash keys stored in the many hash line entries. The storage device stores the hash table. The hash line includes a prefix address column that stores a prefix address. Each entry of the hash line is provided to store a hash key and an offset. The hash computing hardware evaluates an address of the at least one matching hash key by combining the prefix address and an offset of the at least one matching hash key, and the offset of the at least one matching hash key is obtained from an entry storing the at least one matching hash key.

In an exemplary embodiment, the hash computing hardware evaluates the address for a hash key stored in an entry of the hash line by combining the prefix address and an offset stored in the entry. The hash computing hardware determines that an entry stores invalid data when the address evaluated for a hash key stored in the entry is not within a sliding window range of the address of the current hash key.

In an exemplary embodiment, the hash computing hardware determines whether or not all the addresses of hash keys stored in used entries of the hash line are within a sliding window range. When none of the addresses of the hash keys stored in the used entries of the hash line are within the sliding window range, the hash computing hardware determines that the used entries all store invalid data.

In an exemplary embodiment, the hash computing hardware selects a free entry of the hash line to store the current hash key and an offset of the current hash key. In an exemplary embodiment, when all entries of the hash line store valid data, the hash computing hardware releases one of the entries as the free entry to store the current hash key and the offset of the current hash key. An entry storing a hash key whose address is the farthest distance away from the address of the current hash key is selected to be released as the free entry.

In an exemplary embodiment, the hash line has a valid flag column that is further divided into sub-columns corresponding to all entries of the hash line to show that each entry stores valid data or invalid data.

In an exemplary embodiment, there is an overlapping bit between the prefix address and each offset. In an exemplary embodiment, the prefix address is represented by Prefix[(N−1): (M−1)], where N and M are numerical values, and M is less than N. The offset is represented by Offset[(M−1): 0]. In the prefix address Prefix[(N−1): (M−1)], the overlapping bit is Prefix[M−1]. In the offset Offset[(M−1): 0], the overlapping bit is Offset[M−1]. In an exemplary embodiment, the hash computing hardware evaluates the address for a hash key by performing the following calculation:

$$\{Prefix[(N-1):(M-1)],(M-1)'b0\}+Offset[(M-1): 0],$$

where (M−1)'b0 represents (M−1) binary zeros.

In an exemplary embodiment, N is 32 and M is 16, the address of the current hash key is cur_addr[31: 0], and the old value of the prefix address is prefix_old[31: 15]. Old values of offsets stored in used entries of the hash line are offset_old[15: 0]. The hash computing hardware subtracts prefix_old[31: 16] from cur_addr[31: 16] to get a distance of d. The hash computing hardware further determines prefix_old[15] and cur_addr[15].

When d is greater than 1, the hash computing hardware updates the prefix address with {cur_addr[31: 16], 1'b0}, and updates the valid flag column of the hash line to indicate that used entries of the hash line all store invalid data, wherein the valid flag column is further divided into sub-columns corresponding to all entries of the hash line to show that each entry stores valid data or invalid data. When d is greater than 1, the hash computing hardware stores cur_addr[15: 0] to the hash line as an offset of the current hash key.

When d is 1, prefix_old[15] is 0, and cur_addr[15] is 0, the hash computing hardware updates the prefix address with {prefix_old[31: 16], 1'b1}, uses {1'b0, offset_old[14: 0]} to update the offsets stored in the used entries, and stores {1'b1, cur_addr[14: 0]} to the hash line as an offset of the current hash key.

When d is 1, prefix_old[15] is 1, and cur_addr[15] is 0, the hash computing hardware stores {1'b1, cur_addr[14: 0]} to the hash line as an offset of the current hash key.

When d is 1, prefix_old[15] is 0, and cur_addr[15] is 1, the hash computing hardware updates the prefix address with {cur_addr[31: 16], 1'b0}, updates the valid flag column of the hash line to indicate that the used entries of the hash line all store invalid data, and stores cur_addr[15: 0] to the hash line as an offset of the current hash key, wherein the valid flag column is further divided into sub-columns corresponding to all entries of the hash line to show that each entry stores valid data or invalid data.

When d is 1, prefix_old[15] is 1, and cur_addr[15] is 1, the hash computing hardware updates the prefix address with {cur_addr[31: 16], 1'b0}, uses {1'b0, offset_old[14: 0]} to update the offsets stored in the used entries, and stores cur_addr[15: 0] to the hash line as an offset of the current hash key.

When d is 0 and prefix_old[15] is 0, the hash computing hardware stores cur_addr[15: 0] to the hash line as an offset of the current hash key.

The aforementioned hash computing hardware may be implemented in other structures. A data compression method using the aforementioned hash line storage format also belongs to the applications of the present invention. A data compression method in accordance with an exemplary embodiment of the present invention includes the following steps: evaluating the hash value for the current hash key extracted from a source data string; obtaining a hash line corresponding to the hash value from a hash table, wherein the hash line includes a prefix address column that stores a prefix address; performing hash key comparison to find at least one matching hash key that matches the current hash key from among the hash keys stored in the many hash line entries, wherein each entry of the hash line is provided to store a hash key and an offset; and evaluating the address of the at least one matching hash key by combining the prefix address and an offset of the at least one matching hash key, wherein the offset of the at least one matching hash key is obtained from an entry storing the at least one matching hash key.

In an exemplary embodiment of the present invention, each hash line in the hash table includes a prefix address column and a plurality of entries for historical hash data. Each entry stores a hash key and an offset of the hash key. The prefix address column stores a prefix address that is common for all hash keys in the same hash line. Because of the common prefix address stored in a hash line by only a prefix address column, the number of address bits required in each entry for each hash key is reduced. Therefore, the storage space of historical hash keys and their addresses is saved.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

Figure 1:
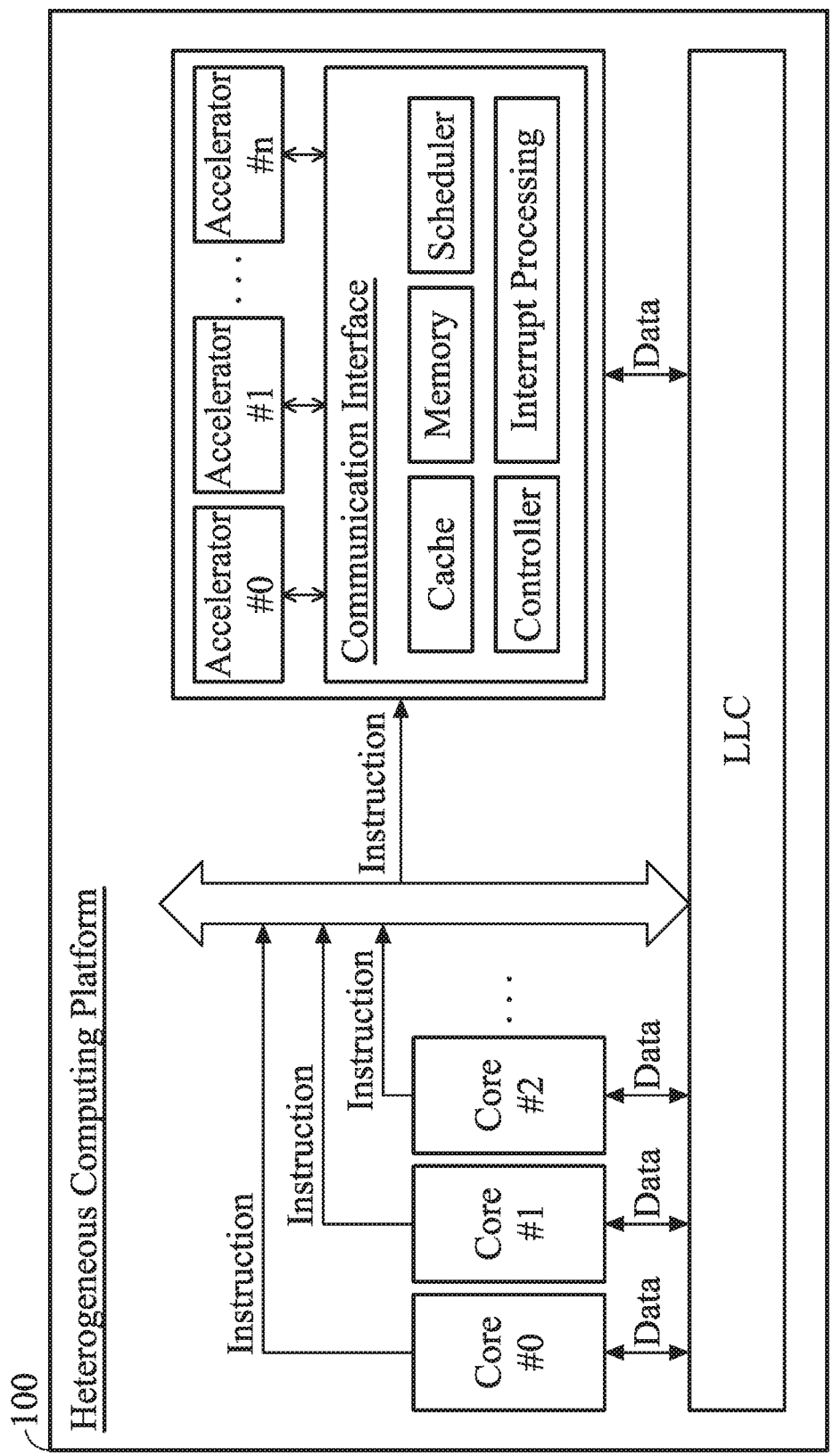
FIG. 1 illustrates a heterogeneous computing platform 100, which integrates a multi-core computing unit (including core #0, core #1, core #2 . . . ) and various accelerators (accelerator #0 . . . accelerator #n)

FIG. 1 illustrates a heterogeneous computing platform 100, which integrates a multi-core computing unit (including core #0, core #1, core #2 . . . ) and various accelerators (accelerator #0 . . . accelerator #n). Each accelerator operates according to instructions issued by the multi-core computing unit, and performs data accessing through a specific communication interface and a last level cache (LLC). One implementation of this present invention is to implement an accelerator for data compression. The data compression accelerator may be integrated into the heterogeneous computing platform 100 of FIG. 1.

Figure 2:
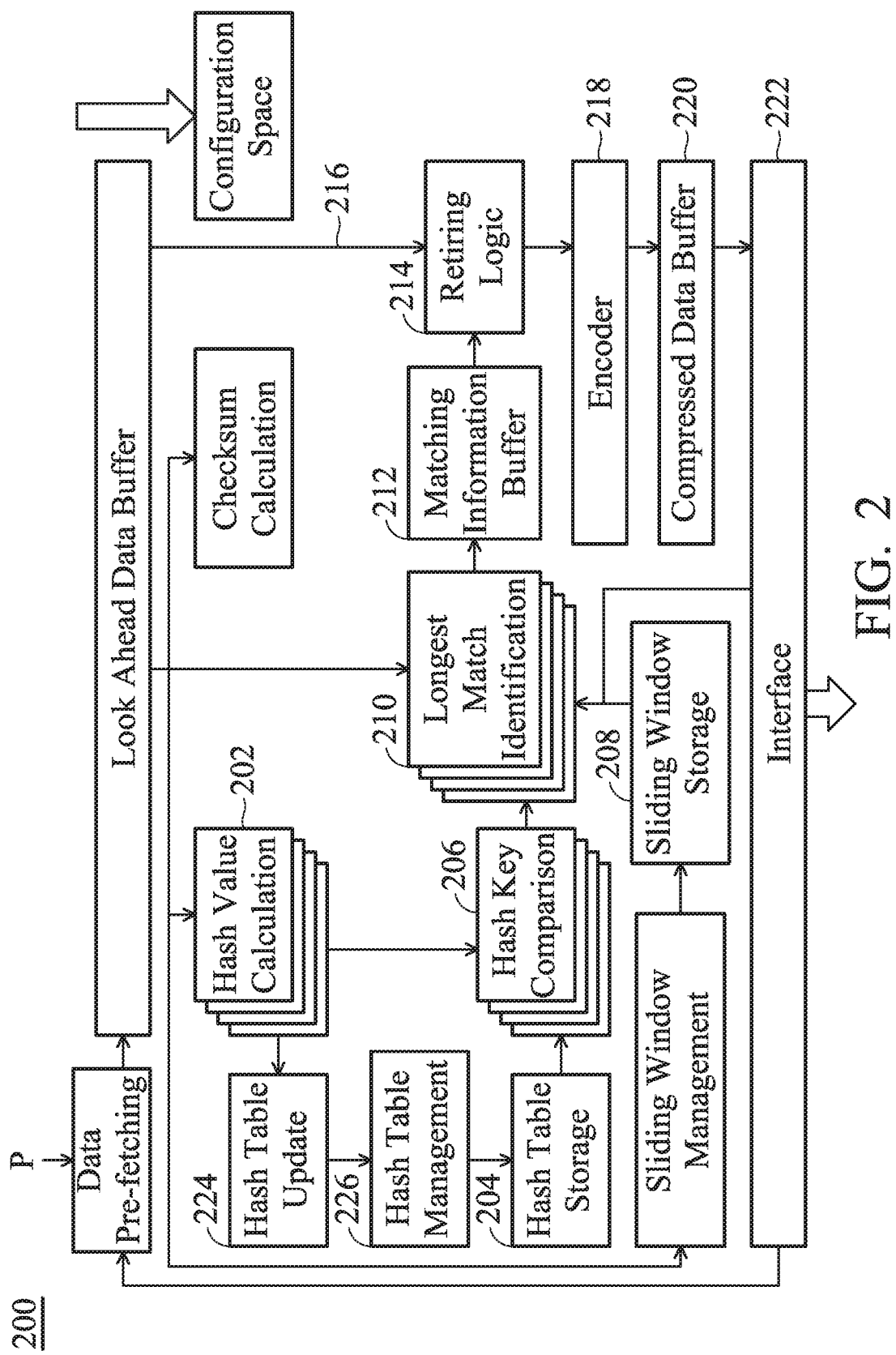
FIG. 2 illustrates a data compressor 200 in accordance with an exemplary embodiment of the present invention.

FIG. 2 illustrates a data compressor 200 in accordance with an exemplary embodiment of the present invention. The data compressor 200 may be the aforementioned data compression accelerator or be applied to other computing architectures. FIG. 2 shows blocks of hardware of the data compressor 200. Each hardware block has a specific function. The hardware blocks may be implemented by logic gates or may be implemented by a software and hardware co-design.

Data fetched from a source data string P form a hash key (for example, including 3 bytes of fetched data). The hash key is input to a hash value calculation block 202 for evaluation of a hash value. From a hash table storage 204, historical hash keys corresponding to the evaluated hash value are obtained from a hash line corresponding to the hash value of a current hash key. A hash key comparison block 206 compares the historical hash keys with the current hash key to find out the matched ones (i.e., matching hash keys, the same as the current hash key). The matching hash keys and their addresses (indicating their positions in the source data string P) are read from the hash line together. Based on the matching hash keys and their addresses, a longest match identification block 210 checks a sliding window storage 208 (for example, including 32 KB of historical part of the source data string) to identify the matched data strings (having a beginning the same as the current hash key) and determines the longest length of the matched data strings. Matching information, including distance (between the matching hash key and the current hash key) and length (e.g., the longest matched length) is buffered in a matching information buffer 212. A retiring logic 214 arranges the unmatched source data 216 and match information read from the matching information buffer 212 in the order of the source data string P to be encoded by an encoder 218 (for example, a deflate, LZ4, LZO or LZS encoder which is developed based on an LZ77 algorithm). In this way, each repeated part is compressed by being replaced by matching information (indicating distance and length). Data compression, therefore, is achieved. The encoded result is buffered in the compressed data buffer 220 and then output through the interface 222.

The hash table update block 224 and the hash table management block 226 are described below.

According to the hash value that the hash value calculation block 202 evaluates corresponding to the current hash key, the hash table update block 224 selects one hash line and updates the selected hash line. The current hash key and the address of the current hash key are pushed into the selected hash line, and the updated hash line is stored back to the hash table storage 204 by the hash table management block 226. The hash table storage 204 is dynamically updated to store historical hash keys when the sliding window is shifting. The hash key comparison block 206 performs hash key comparison based on the dynamically updated historical hash keys. In the present invention, a specific hash line storage format is introduced for the hash table management (226) and, accordingly, a hash table update technology (used in hash table update block 224) is developed.

The operations of the hash computing hardware (including blocks of hardware 202, 206, 224, and 226 of FIG. 2) and the hash table storage 204 are further described below.

Figure 3:
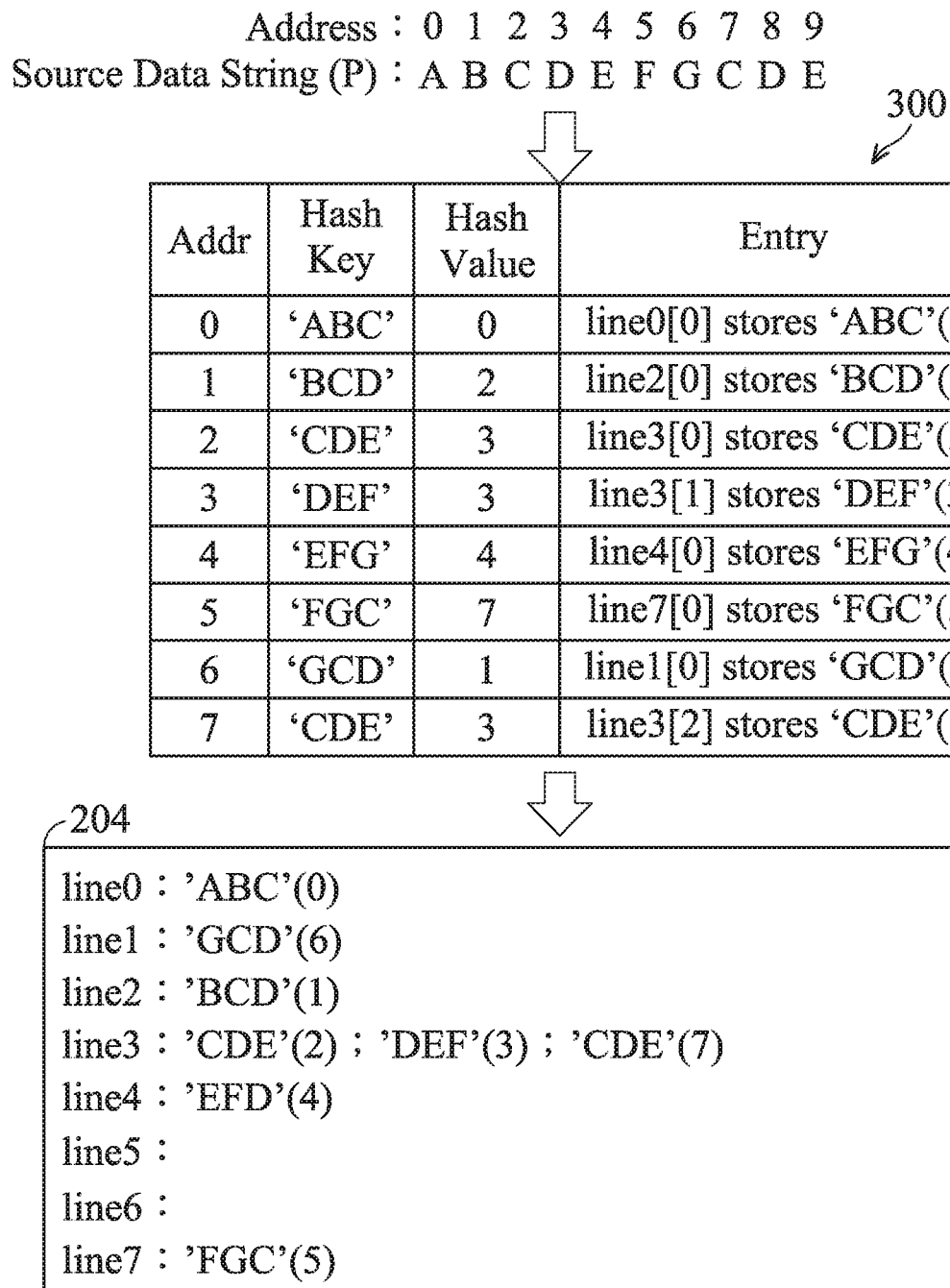
FIG. 3 illustrates the hash calculations performed by the data compressor 200 in accordance with an exemplary embodiment.

FIG. 3 illustrates the hash calculations performed by the data compressor 200 in accordance with an exemplary embodiment. The source data string P is 'ABCDEFGCDE'. Every three bytes constitute a hash key and corresponds to a hash value. Each hash key has an address, indicating where the hash key is in the source data string P. For example, the address of the hash key 'ABC' is 0, the address of the hash key 'BCD' is 1, and so on. Based on the hash value evaluated from the current hash key, a hash line is selected from the hash table. The hash key comparison block (206) performs hash key comparison by comparing the current hash key with the historical hash keys stored in the selected hash line. All matching hash keys and their addresses, therefore, are obtained. In addition, hash table update (by hash table update block 224 and hash table management block 226 of FIG. 2) is performed.

Referring to table 300, the update of the hash table is listed. The hash key 'ABC' with a hash value of 0 and its address 0 are stored to line0[0], entry 0 of hash line 0. In FIG. 3, 'ABC'(0) represents that the hash key 'ABC' is fetched from address 0 of the source data string P. Similarly, as shown, the other hash keys and their addresses are updated to the hash table. FIG. 3 shows the contents stored in the hash table storage 204 as hash lines line0 . . . line7.

In FIG. 3, the hash value calculation block 202 calculates that the hash keys 'CDE' at address 2, 'DEF' at address 3, and 'CDE' at address 7 all have the same hash value 3. Thus, in hash line line3, entries line3[0], line3[1], and line3[2] store 'CDE' (2), 'DEF' (3) and 'CDE' (7), respectfully. Each entry stores a hash key and address information of the hash key. Before 'DEF(3)' is pushed into hash line line3, the current hash key 'DEF' is compared with the historical hash keys already stored in the hash line line3. In this example, only one used entry line3[0] in the hash line line3 stores a historical hash key 'CDE', which is different from the current hash key 'DEF'. Byte 'D' in the current hash key 'DEF' is output without compression. Before 'CDE(7)' is pushed into hash line line3, the current hash key 'CDE' is compared with the historical hash keys already stored in the hash line line3. In this example, historical hash keys stored in the two used entries line3[0] line3[1] of the hash line line3 are 'CDE' and 'DEF'. The current hash key 'CDE' fetched from address 7 is different from the historical hash key 'DEF' that was fetched from address 3, but is the same as the historical hash key 'CDE' that was fetched from address 2. Based on the matching hash key 'CDE' and its address 2, the longest match identification block 210 determines the matched length. Various techniques may determine the longest matched length, which are not repeated here.

In the present invention, a hash line storage format without requiring too many bits is introduced.

Figure 4:
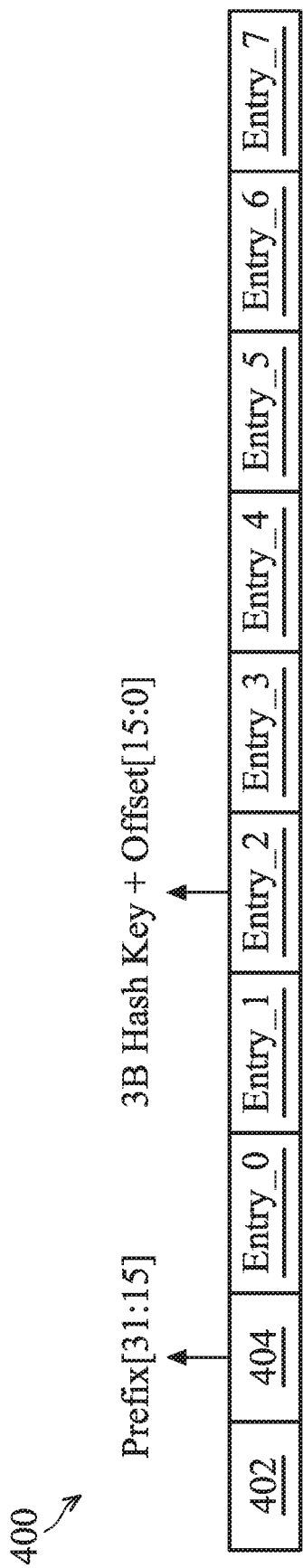
FIG. 4 illustrates a hash line storage format 400 in accordance with an exemplary embodiment of the present invention, which includes eight entries Entry_0 . . . Entry_7.

FIG. 4 illustrates a hash line storage format 400 in accordance with an exemplary embodiment of the present invention, which includes eight entries Entry_0 . . . Entry_7. A valid flag column 402 is provided in the hash line storage format 400. The valid flag column 402 is further divided into sub-columns corresponding to the different entries Entry_0 . . . Entry_7 of the hash line to show that each entry stores valid data or invalid data. The column 402 may include eight bits, corresponding to the eight different entries Entry_0 . . . Entry_7. In an exemplary embodiment, "1" means that the corresponding entry stores valid data and is a used entry, and "0" means that the corresponding bit stores invalid data and is a free entry. In another exemplary embodiment, "0" means that the corresponding entry stores valid data and is a used entry, and "1" means that the corresponding bit stores invalid data and is a free entry. In the following description, "1" is written to the valid flag column 402 corresponding to a used entry that stores valid data and "0" is written to the valid flag column 402 corresponding to a free entry that stores invalid data. Each entry (Entry_0 . . . Entry_7) stores a hash key and its address information that is represented by an offset. There is a prefix address column 404 in the hash line storage format 400. The prefix address column 404 stores a prefix address, which is recorded to be combined with the offset stored in each entry to form an address Addr that indicates a position in the source data string P. That is, for each hash key stored in the entries (Entry_0 . . . Entry_7), the hash computing hardware obtains the complete information of the address Addr by combining the prefix address stored in the prefix address column 404 and the offset obtained from each entry. Notably, those skilled in the art can change the number of entries managed in each hash line to store more or less historical hash data (more or less pairs of hash key and offset) to meet the design requirements. The length of the valid flag column 402 may be changed in response to the change made on the amount of the entries managed in one hash line. For example, the number of bits of the valid flag column 402 may be set to equal to the number of entries managed in one hash line.

In an exemplary embodiment, the sliding window is in a size of 32 KB (32 kilobytes), and each hash key is in a length of 3B (3 bytes). The source data string P may up to 4G in length. The address Addr may be represented in 32 bits. As shown in FIG. 4, the prefix address (404) is a 17-bit value, Prefix[31: 15]. Each entry stores a 3B hash key and a 16-bit offset Offset[15: 0]. The hash line storage format 400 only requires 145 bits (17+8*16=145) to successfully record the address information of eight hash keys.

In contrast, in a conventional technology, each entry stores a complete 32-bit address Addr[31: 0] which is much longer than an offset value. A conventional hash line requires 256 bits (32*8=256) to record the address information of 8 hash keys. Obviously, the hash line storage format 400 proposed in the present invention saves 43% ((256−145)/256=0.43) storage space. The size of the hash table storage 204 need not be too large, which effectively reduces the cost of the data compressor 200.

Figure 5:
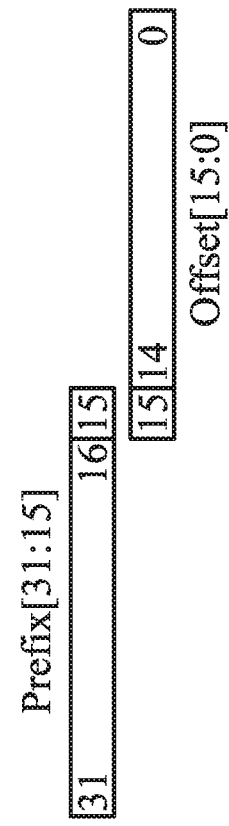
FIG. 5 illustrates how to combine a prefix address, Prefix[31: 15], with an offset, Offset[15: 0], by having one bit (bit[15]) overlapped.

FIG. 5 illustrates how to combine a prefix address, Prefix[31: 15], with an offset, Offset[15: 0], by having one bit (bit [15]) overlapped. The prefix address, Prefix[31: 15], and the offset, Offset[15: 0], are combined to form an address Addr[31: 0]. In an exemplary embodiment, when a hash key is pushed into a hash line, the prefix address Prefix[31: 15] and the offset Offset[15: 0] stored in each entry have to be updated to make the following calculation true:

$$Addr[31:0]=\{Prefix[31:15],15'b0\}+Offset[15:0]$$

15'b0 means 15 binary 0s. {Prefix[31: 15], 15'b0} is a 32-bit binary number [31: 0], wherein the first 17 bits, [31: 15], is Prefix[31: 15], and the final 15 bits are 0s. The hash computing hardware can use the prefix address (Prefix[31: 15]) and the offset (Offset[15: 0] stored in each entry) to form the complete address Addr of each hash key using the forgoing calculation.

Such a hash line storage format 400 in particular needs to consider the cross-border problems of the sliding window.

Figures 6A, 6B:
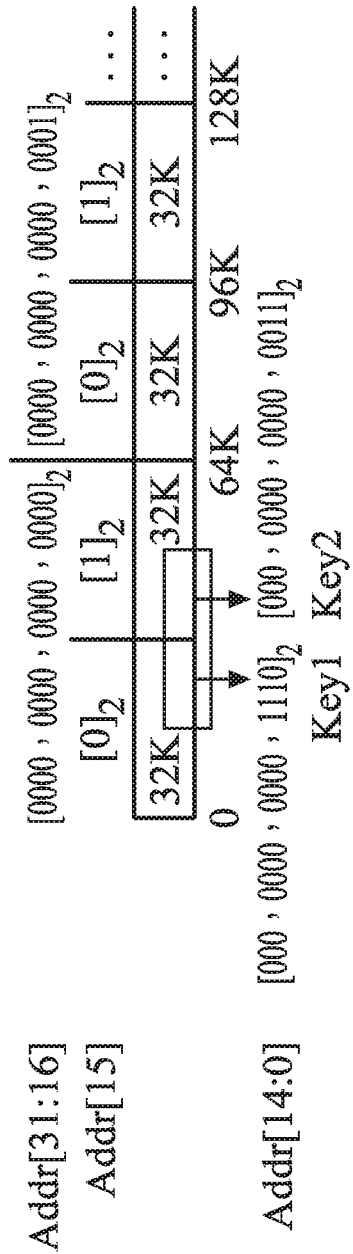
FIG. 6A and FIG. 6B show the cross-border situations of a 32 KB sliding window.

FIG. 6A and FIG. 6B show the cross-border situations of a 32 KB sliding window.

In a source data string P, an address Addr (starting from address 0) is assigned to each byte. For example, referring to the source data string P of FIG. 3, the ten bytes 'ABCDEFGCDE' are addressed from 0 to 9.

A source data string P may be divided into several segments in units of 32 KB. Between two adjacent 32 KB segments, an address bit Addr[15] is changed. For example, in the first 32 KB segment (Addr smaller than 32K), the address bit Addr[15] of every data byte is $[0]_2$. [ ]$_2$ means that the number in [ ] is a binary number. In the second 32 KB segment (Addr equal to or larger than 32K but smaller than 64K), the address bit Addr[15] of every data byte is $[1]_2$. There is a change at the address bit Addr[15] between every two adjacent 32 KB segments.

In another aspect, a source data string P may be divided into several segments in units of 64 KB. Between two adjacent 64 KB segments, the higher address bits Addr[31: 16] is changed by 1. For example, in the first 64 KB segment (Addr smaller than 64K), the higher address bits Addr [31: 16] of every data byte (referred to as the first 64 KB segment high-bit value) is $[0]_{16}$, wherein [ ]$_{16}$ means the number in [ ] is a hexadecimal number. In the second 64 KB segment (Addr equal to or larger than 64K but smaller than 128K), the higher address bits Addr[31: 16] of every data byte (referred to as the second 64 KB segment high-bit value) is $[1]16$. In the third 64 KB segment (Addr equal to or larger than 128K but smaller than 192K), the higher address bits Addr[31: 16] of every data byte (referred to as the third 64 KB segment high-bit value) is $[2]_{16}$. The higher address bits Addr[31: 16] of the following 64 KB segments change in the similar way. As shown, the first 64 KB segment high-bit value $[0]_{16}$ is 1 less than the second 64 KB segment high-bit value $[1]_{16}$, and the second 64 KB segment high-bit value $[1]_{16}$ is 1 less than the third 64 KB segment high-bit value $[2]_{16}$. That is, the second 64 KB segment high-bit value $[0]_{16}$ is 1 greater than the first 64 KB segment high-bit value $[0]_{16}$, and the third 64 KB segment high-bit value $[2]_{16}$ is 1 greater than the first 64 KB segment high-bit value $[0]_{16}$.

The first 32 KB segment and the second 32 KB segment constitute the first 64 KB segment, the third 32 KB segment and the fourth 32 KB segment constitute the second 64 KB segment, and so on. FIGS. 6A and 6B show the 32 KB segments of a source data string P, wherein from left to right every two 32 KB segments form one 64 KB segment. FIGS. 6A and 6B further show a sliding window. In the process of compressing the source data string P, the 32 KB sliding window continuously slides to the right (byte by byte) from the first 32 KB segment until finishing the compression of the entire source data string P.

In FIG. 6A, the 32 KB sliding window covers the cross border between the first and the second 32 KB segments. As shown, hash keys Key1 and Key2 are within the 32 KB sliding window. Hash key Key1 is within the first 32 KB segment. Hash key Key2 is within the second 32 KB segment. There is a 32 KB cross border between the hash keys Key1 and Key2. In FIG. 6B, the 32 KB sliding window cover the cross border between the first and the second 64 KB segments. As shown, hash keys Key3 and Key4 are within the 32 KB sliding window. Hash key Key3 is within the first 64 KB segment. Hash key Key4 is within the second 64 KB segment. There is a 64 KB cross border between the hash keys Key3 and Key4. In the disclosed hash line storage structure 400, the recorded prefix address (Prefix[31: 15]) and the recorded offsets (Offset[15: 0] in each of the entries Entry_0 . . . Entry_7) should be able to reflect the 32 KB and 64 KB cross border address (Addr) changes.

FIG. 6A takes hash keys Key1 and Key2 as examples, and illustrates how the prefix address (Prefix[31: 15]) and the offsets (Offset[15: 0]) in a hash line are modified when the current hash key to be pushed into the hash line is fetched from the next 32 KB segment rather than the same 32 KB segment of the historical hash keys. In this example, as calculated by the hash value calculation block 202, it is determined that the hash value of the hash key Key1 is the same as the hash value of the hash key Key2, and the hash keys Key1 and Key2 are pushed into the same hash line. For example, referring to the example of FIG. 3, the hash values of hash keys 'CDE' and 'DEF' are both 3 and the hash keys 'CDE' and 'DEF' all are pushed into the hash line line3. Since in the same hash line one common prefix address Prefix[31: 15] is recorded for all hash keys, address information of each hash key (key1/key2) needs to be divided into the common prefix address (Prefix[31: 15]) and an offset (Offset[15: 0]). Referring FIG. 6A, the hash key Key1 is within the first 32 KB segment and its address Addr[31: 0] is [0000, 0000, 0000, 0000, 0000, 0000, 0000, 1110]$_2$, that is, the higher bits Addr[31: 16] are [0000, 0000, 0000, 0000]$_2$, an middle bit Addr[15] is $[0]_2$, and the lower bits Addr[14: 0] are [000, 0000, 0000, 1110]$_2$. The hash key Key2 is within in the second 32 KB segment, and its address Addr[31: 0] is [0000, 0000, 0000, 0000, 1000, 0000, 0000, 0011]$_2$, that is, the higher bits Addr[31: 16] are [0000, 0000, 0000, 0000]$_2$, the middle bit Addr[15] is $[1]_2$, and the lower bits Addr[14: 0] are [000, 0000, 0000, 0011]$_2$. Therefore, the prefix address Prefix[31: 15] common to the hash keys Key1 and Key2 can be set to [0000, 0000, 0000, 0000, 0]$_2$. Correspondingly, the offset Offset[15: 0] filled in for the hash key Key1 is [0000, 0000, 0000, 1110]$_2$, and the offset Offset[15: 0] filled in for the hash key Key2 is [1000, 0000, 0000, 0011]$_2$. In this way, the address Addr of the hash key Key1, [0000, 0000, 0000, 0000, 0000, 0000, 0000, 1110]$_2$, and the address Addr of the hash key Key2 [0000, 0000, 0000, 0000, 1000, 0000, 0000, 0011]$_2$ can be correctly evaluated by the calculation: {Prefix[31: 15], 15'b0}+Offset [15: 0].

For example, for the hash key Key1, {Prefix[31: 15], 15'b0} is [0000, 0000, 0000, 0000, 0000, 0000, 0000, 0000]$_2$, and Offset[15: 0] is [0000, 0000, 0000, 1110]$_2$. According to the formula {Prefix[31: 15], 15'b0}+Offset[15: 0], the hash computing hardware evaluates that the address Addr of the hash key Key1 is [0000, 0000, 0000, 0000, 0000, 0000, 0000, 1110]$_2$. For the hash key Key2, {Prefix[31: 15], 15'b0} is [0000, 0000, 0000, 0000, 0000, 0000, 0000, 0000]$_2$, and Offset[15: 0] is [1000, 0000, 0000, 0011]$_2$.

According to the formula {Prefix[31: 15], 15'b0}+Offset[15: 0], the hash computing hardware evaluates that the address Addr of the hash key Key2 is [0000, 0000, 0000, 0000, 1000, 0000, 0000, 0011]$_2$. The problems due to the 32 KB cross borders of a 32 KB sliding windows are correctly handled.

FIG. 6B takes hash keys Key3 and Key4 as examples, and illustrates how the prefix address (Prefix[31: 15]) and the offsets (Offset[15: 0]) in a hash line are modified when the current hash key to be pushed into the hash line is fetched from the next 64 KB segment rather than the same 64 KB segment of the historical hash keys. In this example, as calculated by the hash value calculation block 202, it is determined that the hash value of the hash key Key3 is the same as the hash value of the hash key Key4, and the hash keys Key3 and Key4 are pushed into the same hash line. Since in the same hash line one common prefix address Prefix[31: 15] is recorded for all hash keys, address information of each hash key (key3/key4) needs to be divided into the common prefix address (Prefix[31: 15]) and an offset (Offset[15: 0]). Referring FIG. 6B, the hash key Key3 is within the first 64 KB segment and its address Addr[31: 0] is [0000, 0000, 0000, 0000, 1000, 0000, 0000, 1110]$_2$, that is, the higher bits Addr[31: 16] are [0000, 0000, 0000, 0000]$_2$, an middle bit Addr[15] is [1]$_2$, and the lower bits Addr[14: 0] are [000, 0000, 0000, 1110]$_2$. The hash key Key4 is within in the second 64 KB segment, and its address Addr[31: 0] is [0000, 0000, 0000, 0001, 0000, 0000, 0000, 0011]$_2$, that is, the higher bits Addr[31: 16] are [0000, 0000, 0000, 0001]$_2$, the middle bit Addr[15] is [0]$_2$, and the lower bits Addr[14: 0] are [000, 0000, 0000, 0011]$_2$. Therefore, the prefix address Prefix[31: 15] common to the hash keys Key3 and Key4 can be set to [0000, 0000, 0000, 0000, 1]$_2$. Correspondingly, the offset Offset[15: 0] filled in for the hash key Key3 is [0000, 0000, 0000, 1110]$_2$, and the offset Offset[15: 0] filled in for the hash key Key4 is [1000, 0000, 0000, 0011]$_2$. In this way, the address Addr of the hash key Key3, [0000, 0000, 0000, 0000, 1000, 0000, 0000, 1110]$_2$, and the address Addr of the hash key Key4 [0000, 0000, 0000, 0001, 0000, 0000, 0000, 0011]$_2$ can be correctly evaluated by the calculation: {Prefix[31: 15], 15'b0}+Offset [15: 0].

For example, for the hash key Key3, {Prefix[31: 15], 15'b0} is [0000, 0000, 0000, 0000, 1000, 0000, 0000, 0000]$_2$, and Offset[15: 0] is [0000, 0000, 0000, 1110]$_2$. According to the formula {Prefix[31: 15], 15'b0}+Offset[15: 0], the hash computing hardware evaluates that the address Addr of the hash key Key3 is [0000, 0000, 0000, 0000, 1000, 0000, 0000, 1110]$_2$. For the hash key Key4, {Prefix[31: 15], 15'b0} is [0000, 0000, 0000, 0000, 1000, 0000, 0000, 0000]$_2$, and Offset[15: 0] is [1000, 0000, 0000, 0011]$_2$. According to the formula {Prefix[31: 15], 15'b0}+Offset[15: 0], the hash computing hardware evaluates that the address Addr of the hash key Key4 is [0000, 0000, 0000, 0001, 0000, 0000, 0000, 0011]$_2$. The problems due to the 32 KB cross borders of a 64 KB sliding windows are correctly handled.

There may be various ways to manage a prefix address (Prefix[31: 15]) and offsets (Offset[15: 0] in the different entries Entry_0 . . . Entry_7) in a hash line.

In an exemplary embodiment, in response to a current hash key, the hash computing hardware selects a hash line corresponding to the current hash key, and selects one entry from a plurality of entries of the hash line to store the current hash and an offset of the current hash key.

Specifically, prior to performing the hash table updating (by hash table update block 224 and hash table management block 226 of FIG. 2), the hash computing hardware calculates the distance (d, which is cur_addr[31: 16]−prefix_old [31: 16]) and determines the values of two bits prefix_old [15] and cur_addr[15]. cur_addr[31: 16] is the higher bits of the address cur_addr[31: 0] of the current hash key. prefix_old[31: 16] is the higher bits of an old prefix address prefix_old[31: 15] (which is the prefix address before the update). As there is an overlapping bit between the prefix address and each offset, prefix_old[15] is taken from the old prefix address prefix_old[31: 15], and cur_addr[15] is taken from the current hash key address cur_addr[31: 0]. The hash computing hardware performing hash table updating (by hash table update block 224 and hash table management block 226 of FIG. 2) updates the address information recorded in the selected hash line based on these three values d, prefix_old[15], and cur_addr[15]. The prefix address (Prefix[31: 15]) is updated from the old prefix address prefix_old[31: 15] to a new prefix address prefix_new[31: 15]. The old offset offset_old[15: 0] recorded in each used entry is updated to an updated offset offset_new[15: 0]. The offset of the current hash key is cur_offset[15: 0], which is stored into a free entry with the current hash key.

Figure 7:
FIG. 7 illustrates a table 700 depicting how a hash computing hardware implemented in accordance with an exemplary embodiment of the present invention acts based on d, prefix_old[15], and cur_addr[15]

How to select an appropriate entry from the hash line to store the current hash key is described in this paragraph. Generally, the hash computing hardware selects a free entry that stores only invalid data. An entry is released as a free entry when an address Addr evaluated from the recorded offset offset_old[15: 0] and the prefix address prefix_old[31: 15] is not within a 32 KB sliding window range of the address cur_addr[31: 0] of the current hash key. In another exemplary embodiment, the hash computing hardware may check the prefix address (Prefix[31: 15]) only to determine whether the historical hash keys stored in the used entries of the selected hash line are within the sliding window range of the current hash key address cur_addr[31: 0]. Several examples are shown in FIG. 7. In the first example, it is checked whether the distance d is greater than 1. When the distance d is greater than 1, historical hash keys stored in the used entries of the selected hash line are released as free entries. In the second example wherein the distance d is 1, prefix_old[15] is 0, and cur_addre[15] is 1, historical hash keys stored in the used entries of the selected hash line are also released as free entries. In an exemplary embodiment, the hash computing hardware selects the entry storing a hash key whose address is the farthest away from the address of the current hash key and releases selected entry to store the current hash key and the offset of the current hash key. The details are in FIG. 7.

FIG. 7 further shows how to update the prefix address (Prefix[31: 15]) of a hash line by the new prefix address prefix_new[31: 15] and how to change the old offset offset_old[15: 0] to the new offset offset_new[15: 0] for each historical hash key stored in the used entries of the selected hash line. FIG. 7 also shows the offset cur_offset[15: 0] stored into the selected hash line with the current hash key.

FIG. 7 illustrates a table 700 depicting how a hash computing hardware implemented in accordance with an exemplary embodiment of the present invention acts based on d, prefix_old[15], and cur_addr[15]. The free entries without valid data are marked by the corresponding bits in the valid flag column 402 (for example, deasserted to "0"). The used entries storing historical hash keys that are not within the 32 KB sliding window are released by the disclosed hardware functions, and the problems due to 32 KB and 64 KB cross borders are solved.

When d is greater than 1, the hash computing hardware updates the prefix address with {cur_addr[31: 16], 1'b0}, and updates the valid flag column 402 to indicate that all used entries are released. The hash computing hardware stores cur_addr[15: 0] to the selected hash line as the current hash key offset cur_offset[15: 0]. In detail, when d is greater than 1, it means that the addresses of all historical hash keys stored in the used entries of the selected hash line are not within the 32 KB sliding window range associated with the current hash key address cur_addr[31: 0]. The hash computing hardware uses {cur_addr[31: 16], 1'b0} (where 1'b0 represents one bit of 0, the same below) to update the prefix address Prefix[31: 15], and uses '0' to update the bits corresponding to the used entries in the valid flag column 402. The data in the used entries are regarded as invalid data and these used entries are released. The hash computing hardware may select entry Entry_0 to store the current hash key and changes the bit corresponding to entry Entry_0 in the valid flag column 402 to 1 to indicate that the entry Entry_0 stores valid data now. In addition to the current hash key, the hash computing hardware stores cur_addr[15: 0] to entry Entry_0 as the offset cur_offset[15: 0] of the current hash key. Note that when d is greater than 1, all used entries in the selected hash line store invalid data. The hash computing hardware may select any entry among Entry_0 . . . Entry_7 (not limited to the first free entry Entry_0) to store the current hash key. The invention is not limited herein.

When d is 1, prefix_old[15] is 0, and cur_addr[15] is 0, the hash computing hardware updates the prefix address with {prefix_old[31: 16], 1'b1}, uses {1'b0, offset_old[14: 0]} to update the offsets stored in the used entries of the selected hash line, and stores {1'b1, cur_addr[14: 0]} to the select hash line as the current hash key offset cur_offset[15: 0]. In detail, when d is 1, prefix_old[15] is 0, and cur_addr[15] is 0, it means that the current hash key is in the next 64 KB segment rather in the same 64 KB segment of the historical hash keys stored in the used entries of the selected hash line. The hash computing hardware updates the prefix address Prefix[31: 15] with {prefix_old[31: 16], 1'b1} (where 1'b1 represents one bit of 1, the same below), and uses {1'b0, offset_old[14: 0]} to update the offsets Offset[15: 0] stored in the used entries of the selected hash line. Referring to the valid flag column 402, the hash computing hardware selects a free entry (storing only invalid data and indicated by 0 in the valid flag column 402) from the selected hash line to store the current hash key and its offset curr_offset[15: 0]. The hash computing hardware stores {1'b1, cur_addr[14: 0]} as the offset curr_offset[15: 0] of the current hash key. Note that when all entries in the selected hash line stores valid data (e.g., all the bits in the valid flag column 402 are 1), the hash computing hardware releases one of the entries to store the current hash key and its offset. The address of the hash key originally stored in the released entry is the farthest one away from the current hash key address cur_addr[31: 0]. For example, the hash computing hardware may subtract the current hash key address cur_addr[31: 0] from the address of each historical hash key obtained from the used entries. Eight distances are evaluated. The entry corresponding to the largest distance is selected to be released for the storage of the current hash key and its offset.

When d is 1, prefix_old[15] is 1, and cur_addr[15] is 0, the hash computing hardware stores {1'b1, cur_addr[14: 0]} to the selected hash line as the current hash key offset cur_offset[15: 0]. In detail, when d is 1, prefix_old[15] is 1, and cur_addr[15] is 0, it means that the current hash key is in the same 32 KB segment with the historical hash keys stored in the used entries of the selected hash line. There is no need to change the prefix address recorded in the hash line and the offsets of the historical hash keys stored in the used entries. According to the valid flag column 402, the hash computing hardware selects a free entry (storing only invalid data and indicated by 0 in the valid flag column 402) to store the current hash key and its offset. The hash computing hardware stores {1'b1, cur_addr[14: 0]} as the current hash key offset cur_offset[15: 0]. When all the entries in the hash line are used (that is, all storing valid data and indicated by 1 in the valid flag column 402), the hash computing hardware releases one entry to store the current hash key and its offset. The same releasing technique applied to the case wherein d is 1, prefix_old[15] is 0, and cur_addr[15] is 0 may be adopted, and the details are not be described again here.

When d is 1, prefix_old[15] is 0, and cur_addr[15] is 1, the hash computing hardware updates the prefix address with {cur_addr[31: 16], 1'b0}, updates the valid flag column 402 to mark that all entries store invalid data, and stores cur_addr [15: 0] to the selected hash line as the current hash key offset cur_offset[15: 0]. In detail, when d is 1, prefix_old[15] is 0, and cur_addr[15] is 1, it means that all historical hash keys stored in the used entries of the selected hash line are not within the 32K sliding window range of the current hash key. The hash computing hardware uses {cur_addr[31: 16], 1'b0} to update the prefix address Prefix[31: 15], and uses 0 to update all bits in the valid flag column 402 to release all entries of the hash line. The hash computing hardware may select to store the current hash key in entry Entry_0 of the hash line, use 1 to update the bit corresponding to the entry Entry_0 in the valid flag column 402 to indicate that the content stored in the entry Entry_0 is valid, and stores cur_addr[15: 0] in the selected hash table as the current hash key offset cur_offset[15: 0]. Note that when d is 1, prefix_ old[15] is 0, and cur_addr[15] is 1, all used entries of the hash line store invalid data. The hash computing hardware can select any of the entries Entry_0 . . . Entry_7 to store the current hash key and its offset.

When d is 1, prefix_old[15] is 1, and cur_addr[15] is 1, the hash computing hardware updates the prefix address with {cur_addr[31: 16], 1'b0}, and uses {1'b0, offset_old[14: 0]} to perform offset update for the historical hash keys stored in the used entries of the selected hash line, and stores cur_addr[15: 0] to the selected hash table as the offset cur_offset[15: 0] of the current hash key. In detail, when d is 1, prefix_old[15] is 1, and cur_addr[15] is 1, it means that the current hash key is in the next 32 KB segment rather than in the same 32 KB segment of the historical hash keys stored in used entries of the selected hash line. The hash computing hardware updates the prefix address Prefix[31: 15] with {cur_addr[31: 16], 1'b0}, and uses {1'b0, offset_old[14: 0]} to update the offset Offset[15: 0] of each historical hash key stored in each used entry of the hash line. According to the valid flag column 402, the hash computing hardware selects a free entry (storing only invalid data and indicated by 0 in the valid flag column 402) from the hash line to store the current hash key and its offset, wherein cur_addr[15: 0] is stored in the selected entry as the current hash key offset cur_offset[15: 0]. When all entries in the hash line store valid data (e.g., all the bits in the valid flag column 402 are 1), the hash computing hardware releases one entry to store the current hash key and its offset. The same releasing technique applied to the case wherein d is 1, prefix_old[15] is 0, and cur_addr[15] is 0 may be adopted, and the details are not be described again here.

When d is 0 and prefix_old[15] is 0, the hash computing hardware stores cur_addr[15: 0] to the selected hash line as the current hash key offset cur_offset[15: 0]. In detail, when d is 0 and prefix_old[15] is 0, it means that the historical hash keys stored in the used entries of the selected hash line and the current hash key are within the same 32K segment. In this case, there is no need to change the prefix address recorded in the hash line and the offsets stored in each used entry is kept. According to the valid flag column 402, the hash computing hardware selects a free entry (storing only invalid data and indicated by 0 in the valid flag column 402) from the hash line to store the current hash key, and stores cur_addr[15: 0] as the current hash key offset cur_offset[15: 0]. When all entries in the hash line store valid data (e.g., all the bits in the valid flag column 402 are 1), the hash computing hardware releases one entry to store the current hash key and its offset. The same releasing technique applied to the case wherein d is 1, prefix_old[15] is 0, and cur_addr [15] is 0 may be adopted, and the details are not be described again here.

For example, when storing a current hash key in entry Entry 3, the hash computing hardware also stores the offset cur_offset[15: 0] of the current hash key (referring to table 700) in the cell Entry_3 with the current hash key, and adjusts the prefix address Prefix[31: 15] recorded in the prefix address column 404, the three offsets Offset[15: 0] recorded in the used entries Entry_0 to Entry_2, and the valid flag column 402. The adjustments may refer to table 700, which lists the values for setting prefix_new[31: 15] and offset_new[15: 0].

Figure 8:
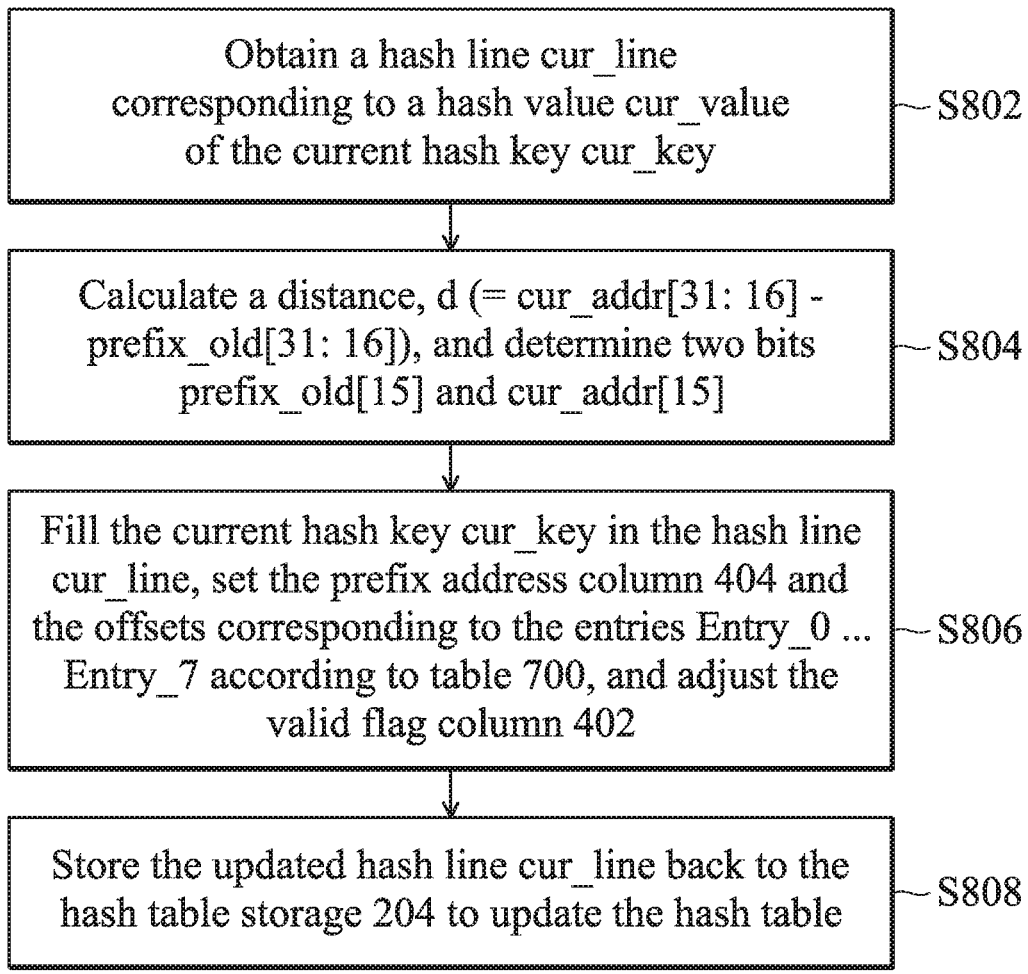
FIG. 8 illustrates the flow to update the hash table.

FIG. 8 illustrates the flow to update the hash table.

To update the hash table in response to a current hash key cur_key, step S802 is performed to obtain a hash line cur_line corresponding to a hash value cur value of the current hash key cur_key from the hash table. A hash key comparison procedure is performed based on the obtained hash line cur_line and then the hash line cur_line is updated. The update of the hash line cur_line is performed in the following steps.

In step S804, a distance, d (=cur_addr[31: 16]−prefix_old [31: 16]), is calculated, and two bits prefix_old[15] and cur_addr[15] are determined.

In step S806, the current hash key cur_key is filled in the hash line cur_line. In an exemplary embodiment, a free entry indicated in the valid flag column 402 is selected from the hash line cur_line to store the current hash key cur_key. If the valid flag column 402 shows that all entries are occupied by valid data, the hash computing hardware in the present invention may release an entry to store the input hash key cur_key. The entry to be released may store a hash key whose address is at the largest distance away from address cur_addr of the current hash key cur_key. In step S806, the prefix address column 404 and the offsets corresponding to the entries Entry_0 . . . Entry_7 are set to prefix_new[31: 15], offset_new[15: 0], and cur_offset[15: 0] (referring to table 700), and the valid flag column 402 may be adjusted accordingly.

In step S808, the updated hash line cur_line is stored back to the hash table storage 204, so that the hash table is updated.

The aforementioned technique may also be used for sliding windows of other sizes. In an exemplary embodiment, the hash computing hardware may complete all steps S804, S806, and S808 in one clock cycle.

In an exemplary embodiment, each hash key address is represented by a 32-bit binary number. When the sliding window slides across the 4G boundary, the address will be reset to 0. There may be a problem to compress a source data string with a length greater than 4 GB (Gigabyte). To solve this problem, the hash table may be reset at the 4G boundaries. In an exemplary embodiment, all bits of each valid flag column 402 are reset to zeros at the 4G boundaries.

In an exemplary embodiment, the sliding window size is $2^{M-1}$B. In the hash line storage format of the present invention, the stored prefix address is Prefix[(N−1): (M−1)], and the stored offset is Offset[(M−1): 0]. N and M are numerical values, and M is less than N. There is an overlapping bit between the prefix address Prefix[(N−1): (M−1)] and the offset Offset[(M−1): 0]. In the prefix address Prefix[(N−1): (M−1)], the overlapping bit is Prefix[M−1]. In the offset Offset[(M−1): 0], the overlapping bit is Offset[M−1]. For a hash key, an address in the source data string is evaluated by the calculation: {Prefix[(N−1): (M−1)], (M−1)'b0}+Offset [(M−1): 0].

The hash computing hardware design may be adaptive to the sliding window size to make the following calculation true:

Addr[(N−1):0]={Prefix[(N−1):(M−1)],(M−1)'b0}+ Offset[(M−1): 0].

The forgoing data compression may be implemented by software. Data compression software may use the aforementioned hash line storage format. The historical hash keys may be recorded on the system memory in the aforementioned hash line storage format. The data compression methods implemented based on the hash line storage format also belongs to the protection scope of this case.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data compressor, comprising:
a hash computing hardware, configured to evaluate a hash value for a current hash key extracted from a source data string, obtain a hash line corresponding to the hash value from a hash table, and perform hash key comparison to find at least one matching hash key that matches the current hash key from hash keys stored in a plurality of entries of the hash line;
a storage device, storing the hash table,
wherein:
the hash line includes a prefix address column that stores a prefix address;
each entry of the hash line is provided to store a hash key and an offset; and
the hash computing hardware evaluates an address of the at least one matching hash key by combining the prefix address and an offset of the at least one matching hash key, and the offset of the at least one matching hash key is obtained from an entry storing the at least one matching hash key.

2. The data compressor as claimed in claim 1, wherein:
the hash computing hardware evaluates an address for a hash key stored in an entry of the hash line by combining the prefix address and an offset stored in the entry; and
the hash computing hardware determines that an entry stores invalid data when an address evaluated for a hash key stored in the entry is not within a sliding window range of an address of the current hash key.

3. The data compressor as claimed in claim 1, wherein:
the hash computing hardware determines whether or not all addresses of hash keys stored in used entries of the hash line are within a sliding window range; and when none of the addresses of the hash keys stored in the used entries of the hash line are within the sliding window range, the hash computing hardware determines that the used entries all store invalid data.

4. The data compressor as claimed in claim 1, wherein:
the hash computing hardware selects a free entry of the hash line to store the current hash key and an offset of the current hash key.

5. The data compressor as claimed in claim 4, wherein:
when all entries of the hash line store valid data, the hash computing hardware releases one of the entries as the free entry to store the current hash key and the offset of the current hash key; and
an entry storing a hash key whose address is the farthest distance away from the address of the current hash key is selected to be released as the free entry.

6. The data compressor as claimed in claim 1, wherein:
the hash line has a valid flag column that is further divided into sub-columns corresponding to all entries of the hash line to show that each entry stores valid data or invalid data.

7. The data compressor as claimed in claim 1, wherein:
there is an overlapping bit between the prefix address and each offset.

8. The data compressor as claimed in claim 7, wherein:
the prefix address is represented by Prefix[(N−1): (M−1)], where N and M are numerical values, and M is less than N;
the offset is represented by Offset[(M−1): 0];
in the prefix address Prefix[(N−1): (M−1)], the overlapping bit is Prefix[M−1]; and
in the offset Offset[(M−1): 0], the overlapping bit if Offset[M−1].

9. The data compressor as claimed in claim 8, wherein:
the hash computing hardware evaluates the address for a hash key by performing a calculation:

$$\{Prefix[(N-1):(M-1)],(M-1)'b0\}+Offset[(M-1):0],$$

where (M−1)'b0 represents (M−1) binary zeros.

10. The data compressor as claimed in claim 8, wherein:
N is 32 and M is 16;
the address of the current hash key is cur_addr[31: 0];
an old value of the prefix address is prefix_old[31: 15];
the hash computing hardware subtracts prefix_old[31: 16] from cur_addr[31: 16] to get a distance of d;
when d is greater than 1, the hash computing hardware updates the prefix address with {cur_addr[31: 16], 1'b0}, and updates the valid flag column of the hash line to indicate that used entries of the hash line all store invalid data, wherein the valid flag column is further divided into sub-columns corresponding to all entries of the hash line to show that each entry stores valid data or invalid data; and
when d is greater than 1, the hash computing hardware stores cur_addr[15: 0] to the hash line as an offset of the current hash key.

11. The data compressor as claimed in claim 8, wherein:
N is 32 and M is 16;
the address of the current hash key is cur_addr[31: 0];
the old value of the prefix address is prefix_old[31: 15];
the hash computing hardware subtracts prefix_old[31: 16] from cur_addr[31: 16] to get a distance of d;
old values of offsets stored in used entries of the hash line are offset_old[15: 0];
the hash computing hardware determines prefix_old[15] and cur_addr[15];

when d is 1, prefix_old[15] is 0, and cur_addr[15] is 0, the hash computing hardware updates the prefix address with {prefix_old[31: 16], 1'b1}, uses {1'b0, offset_old [14: 0]} to update the offsets stored in the used entries, and stores {1'b1, cur_addr[14: 0]} to the hash line as an offset of the current hash key;
when d is 1, prefix_old[15] is 1, and cur_addr[15] is 0, the hash computing hardware stores {1'b1, cur_addr[14: 0]} to the hash line as an offset of the current hash key;
when d is 1, prefix_old[15] is 0, and cur_addr[15] is 1, the hash computing hardware updates the prefix address with {cur_addr[31: 16], 1'b0}, updates the valid flag column of the hash line to indicate that the used entries of the hash line all store invalid data, and stores cur_addr[15: 0] to the hash line as an offset of the current hash key, wherein the valid flag column is further divided into sub-columns corresponding to all entries of the hash line to show that each entry stores valid data or invalid data;
when d is 1, prefix_old[15] is 1, and cur_addr[15] is 1, the hash computing hardware updates the prefix address with {cur_addr[31: 16], 1'b0}, uses {1'b0, offset_old [14: 0]} to update the offsets stored in the used entries, and stores cur_addr[15: 0] to the hash line as an offset of the current hash key; and
when d is 0 and prefix_old[15] is 0, the hash computing hardware stores cur_addr[15: 0] to the hash line as an offset of the current hash key.

12. A data compression method, comprising:
evaluating a hash value for a current hash key extracted from a source data string;
obtaining a hash line corresponding to the hash value from a hash table, wherein the hash line includes a prefix address column that stores a prefix address;
performing hash key comparison to find at least one matching hash key that matches the current hash key from among the hash keys stored in a plurality of entries of the hash line, wherein each entry of the hash line is provided to store a hash key and an offset; and
evaluating an address of the at least one matching hash key by combining the prefix address and an offset of the at least one matching hash key, wherein the offset of the at least one matching hash key is obtained from an entry storing the at least one matching hash key.

13. The data compression method as claimed in claim 12, further comprising:
evaluating the address for a hash key stored in an entry of the hash line by combining the prefix address and an offset stored in the entry; and
determining that an entry stores invalid data when the address evaluated for a hash key stored in the entry is not within a sliding window range of the address of the current hash key.

14. The data compression method as claimed in claim 12, further comprising:
determining whether or not all the addresses of hash keys stored in used entries of the hash line are within a sliding window range; and
when none of the addresses of the hash keys stored in the used entries of the hash line are within the sliding window range, determining that the used entries all store invalid data.

15. The data compression method as claimed in claim 12, further comprising:
selecting a free entry of the hash line to store the current hash key and an offset of the current hash key.

16. The data compression method as claimed in claim 15, further comprising:
  when all entries of the hash line store valid data, releasing one of the entries as the free entry to store the current hash key and the offset of the current hash key,
  wherein an entry storing a hash key whose address is the farthest distance away from the address of the current hash key is selected to be released as the free entry.

17. The data compression method as claimed in claim 12, wherein:
  the hash line has a valid flag column that is further divided into sub-columns corresponding to all entries of the hash line to show that each entry stores valid data or invalid data.

18. The data compression method as claimed in claim 12, wherein:
  there is an overlapping bit between the prefix address and each offset.

19. The data compression method as claimed in claim 18, wherein:
  the prefix address is represented by Prefix[(N−1): (M−1)], where N and M are numerical values, and M is less than N;
  the offset is represented by Offset[(M−1): 0];
  in the prefix address Prefix[(N−1): (M−1)], the overlapping bit is Prefix[M−1]; and
  in the offset Offset[(M−1): 0], the overlapping bit is Offset[M−1].

20. The data compression method as claimed in claim 19, further comprising:
  evaluating the address for a hash key by performing the following calculation:
    {Prefix[(N−1):(M−1)],(M−1)'b0}+Offset[(M−1):0],
  where (M−1)'b0 represents (M−1) binary zeros.

21. The data compression method as claimed in claim 19, wherein N is 32 and M is 16, the address of the current hash key is cur_addr[31: 0], the old value of the prefix address is prefix_old[31: 15], and the data compression method further comprises:
  subtracting prefix_old[31: 16] from cur_addr[31: 16] to get a distance of d;
  when d is greater than 1, the prefix address is updated with {cur_addr[31: 16], 1'b0}, and the valid flag column of the hash line is updated to indicate that used entries of the hash line all store invalid data, wherein the valid flag column is further divided into sub-columns corresponding to all entries of the hash line to show that each entry stores valid data or invalid data; and
  when d is greater than 1, storing cur_addr[15: 0] to the hash line as an offset of the current hash key.

22. The data compression method as claimed in claim 19, wherein N is 32 and M is 16, the address of the current hash key is cur_addr[31: 0], the old value of the prefix address is prefix_old[31: 15], old values of offsets stored in used entries of the hash line are offset_old[15: 0], and the data compression method further comprises:
  subtracting prefix_old[31: 16] from cur_addr[31: 16] to get a distance of d;
  determining prefix_old[15] and cur_addr[15];
  when d is 1, prefix_old[15] is 0, and cur_addr[15] is 0, updating the prefix address with {prefix_old[31: 16], 1'b1}, using {1'b0, offset_old[14: 0]} to update the offsets stored in the used entries, and storing {1'b1, cur_addr[14: 0]} to the hash line as an offset of the current hash key;
  when d is 1, prefix_old[15] is 1, and cur_addr[15] is 0, storing {1'b1, cur_addr[14: 0]} to the hash line as an offset of the current hash key;
  when d is 1, prefix_old[15] is 0, and cur_addr[15] is 1, updating the prefix address with {cur_addr[31: 16], 1'b0}, updating the valid flag column of the hash line to indicate that the used entries of the hash line all store invalid data, and storing cur_addr[15: 0] to the hash line as an offset of the current hash key, wherein the valid flag column is further divided into sub-columns corresponding to all entries of the hash line to show that each entry stores
  when d is 1, prefix_old[15] is 1, and cur_addr[15] is 1, updating the prefix address with {cur_addr[31: 16], 1'b0}, using {1'b0, offset_old[14: 0]} to update the offsets stored in the used entries, and storing cur_addr[15: 0] to the hash line as an offset of the current hash key; and
  when d is 0 and prefix_old[15] is 0, storing cur_addr[15: 0] to the hash line as an offset of the current hash key.

* * * * *